(12) United States Patent
Takei (10) Patent No.: US 9,312,330 B2
(45) Date of Patent: Apr. 12, 2016

(54) SUPER-JUNCTION SEMICONDUCTOR DEVICE

(75) Inventor: Manabu Takei, Shiojiri (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 65 days.

(21) Appl. No.: 13/319,756

(22) PCT Filed: Jul. 13, 2010

(86) PCT No.: PCT/JP2010/004549
§ 371 (c)(1),
(2), (4) Date: Dec. 13, 2011

(87) PCT Pub. No.: WO2011/007560
PCT Pub. Date: Jan. 20, 2011

(65) Prior Publication Data
US 2012/0086076 A1   Apr. 12, 2012

(30) Foreign Application Priority Data
Jul. 15, 2009   (JP) .................................. 2009-166784

(51) Int. Cl.
| H01L 29/66 | (2006.01) |
| H01L 29/06 | (2006.01) |
| H01L 29/10 | (2006.01) |
| H01L 29/78 | (2006.01) |

(52) U.S. Cl.
CPC ........ *H01L 29/0634* (2013.01); *H01L 29/0696* (2013.01); *H01L 29/1095* (2013.01); *H01L 29/7802* (2013.01); *H01L 29/7811* (2013.01)

(58) Field of Classification Search
CPC ............ H01L 29/1095; H01L 29/7802; H01L 29/0696; H01L 29/0634

USPC .......................................... 257/341; 438/270
See application file for complete search history.

(56) References Cited

U.S. PATENT DOCUMENTS

| 6,204,097 | B1 * | 3/2001 | Shen et al. ..................... 438/133 |
| 6,291,856 | B1 * | 9/2001 | Miyasaka et al. .............. 257/335 |
| 6,611,021 | B1 * | 8/2003 | Onishi et al. .................. 257/328 |
| 6,673,679 | B1 * | 1/2004 | Miyasaka et al. ............. 438/268 |
| 6,677,626 | B1 * | 1/2004 | Shindou et al. ................ 257/266 |
| 6,683,347 | B1 * | 1/2004 | Fujihira ........................ 257/341 |

(Continued)

FOREIGN PATENT DOCUMENTS

| JP | 2005-197497 A | 7/2005 |
| JP | 2006-278826 A | 10/2006 |

(Continued)

OTHER PUBLICATIONS

International Search Report dated Oct. 19, 2010 in corresponding Japanese patent application No. JP2010/004549.

*Primary Examiner* — Lex Malsawma
*Assistant Examiner* — Eric Jones
(74) *Attorney, Agent, or Firm* — Rossi, Kimms & McDowell LLP (57) ABSTRACT

Provision of a super-junction semiconductor device capable of reducing rises in transient on-resistance at the time of repeated switching operation. A super-junction structure is provided that has a striped parallel surface pattern, where a super-junction stripe and a MOS cell 6 stripe are parallel, and a p column Y2 over which no MOS cell 6 stripe is arranged and a p column Y1 over which the MOS cell 6 stripe is arranged are connected at an end.

7 Claims, 12 Drawing Sheets

(56) References Cited

U.S. PATENT DOCUMENTS

| | | | |
|---|---|---|---|
| 6,693,323 B2 * | 2/2004 | Sato et al. | 257/341 |
| 2002/0088990 A1 * | 7/2002 | Iwamoto et al. | 257/136 |
| 2003/0183858 A1 * | 10/2003 | Kitagawa et al. | 257/288 |
| 2004/0065921 A1 * | 4/2004 | Iwamoto et al. | 257/341 |
| 2005/0012121 A1 * | 1/2005 | Tihanyi et al. | 257/256 |
| 2005/0156235 A1 * | 7/2005 | Fujihira | H01L 29/0619 257/341 |
| 2006/0220156 A1 | 10/2006 | Saito | |
| 2007/0001194 A1 * | 1/2007 | Ono et al. | 257/127 |
| 2007/0132012 A1 * | 6/2007 | Saito | 257/327 |
| 2007/0272979 A1 | 11/2007 | Saito | |
| 2008/0246085 A1 * | 10/2008 | Saito | H01L 29/0634 257/342 |
| 2010/0308399 A1 * | 12/2010 | Saito et al. | 257/329 |

FOREIGN PATENT DOCUMENTS

| | | |
|---|---|---|
| JP | 2006-351713 A | 12/2006 |
| JP | 2007-335844 A | 12/2007 |
| JP | 2008-010896 A | 1/2008 |
| JP | 2008-258327 A | 10/2008 |

* cited by examiner

Prior Art

FIG. 4

Prior Art

SUPER-JUNCTION SEMICONDUCTOR DEVICE

This application is a U.S. National Phase Application of PCT International Application PCT/JP2010/004549, filed on Jul. 13, 2010, which is based on and claims priority from JP2009-166784, filed on Jul. 15, 2009. The contents of the documents cited in this paragraph are hereby incorporated herein by reference in their entireties.

TECHNICAL FIELD

The present invention relates to a super-junction semiconductor device, and more particularly, to a super-junction (hereinafter, occasionally abbreviated as SJ) MOSFET.

BACKGROUND ART

A MOSFET has been developed that breaks a conventional characteristic limit, using a super-junction structure in which p-type and n-type regions are arranged in parallel, alternating in position in a plane parallel to the primary plane of a semiconductor substrate. One method of forming this super-junction structure is by a multi-step epi system, a structure where an epi layer is incrementally grown so that plural p-type and n-type regions called laminar layers, reeds, or columns (pillars), which extend in a direction perpendicular to the primary plane of the semiconductor substrate are formed to be arranged alternating in position and in parallel along the direction of the plane parallel to the primary plane of the semiconductor substrate (this structure will hereinafter be referred to as pn column structure or simply as column structure) by ion implantation using a mask. "epi" is an abbreviation of epitaxial, which may be abbreviated as "epi" hereinafter.

A trench implant epi system is a method of forming the pn column structure described above by forming plural trenches of a high aspect ratio on the n-type epi substrate and implanting the p-type silicon by epitaxial growth into these trenches. As compared with the MOSFET of an ordinary junction structure, the pn column structure formed by either system is excellent in that the tradeoff between on-resistance and withstanding voltage characteristics may be improved, since a high withstanding voltage is attainable even when using p and n columns of low resistivity.

Figure 3:
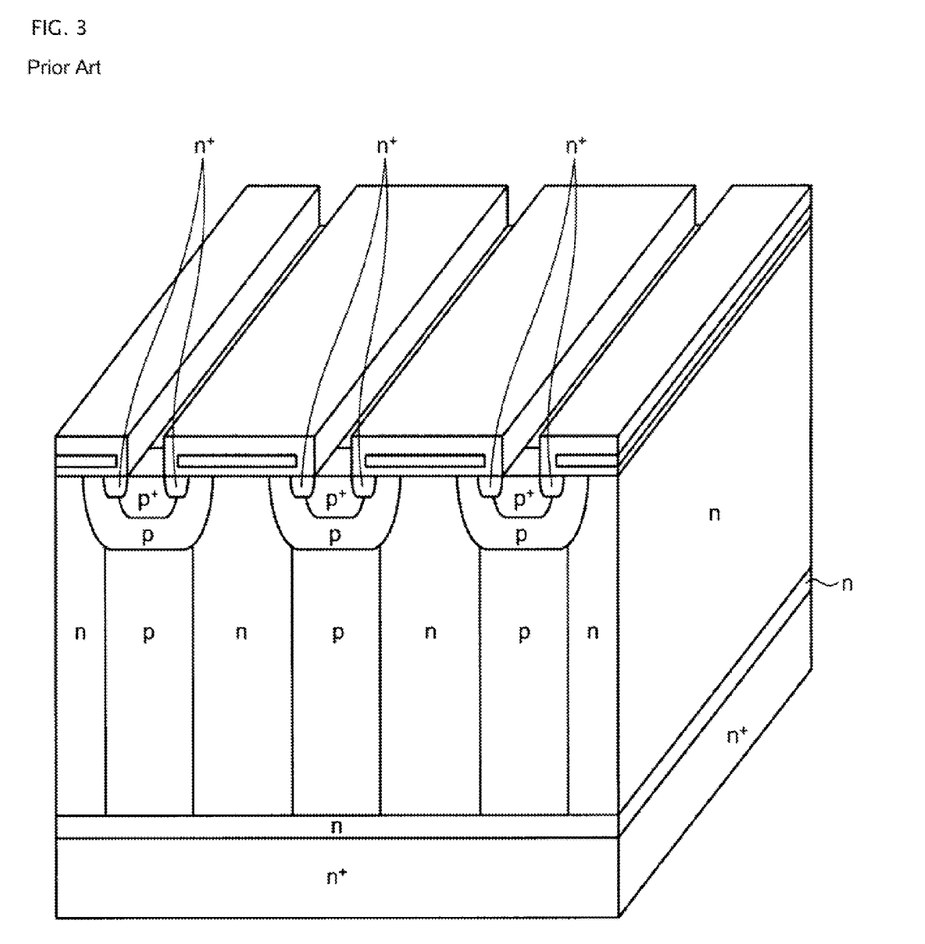
FIG. 3 is a partial cross-sectional perspective diagram of a conventional SJ-MOSFET.
Figure 4:
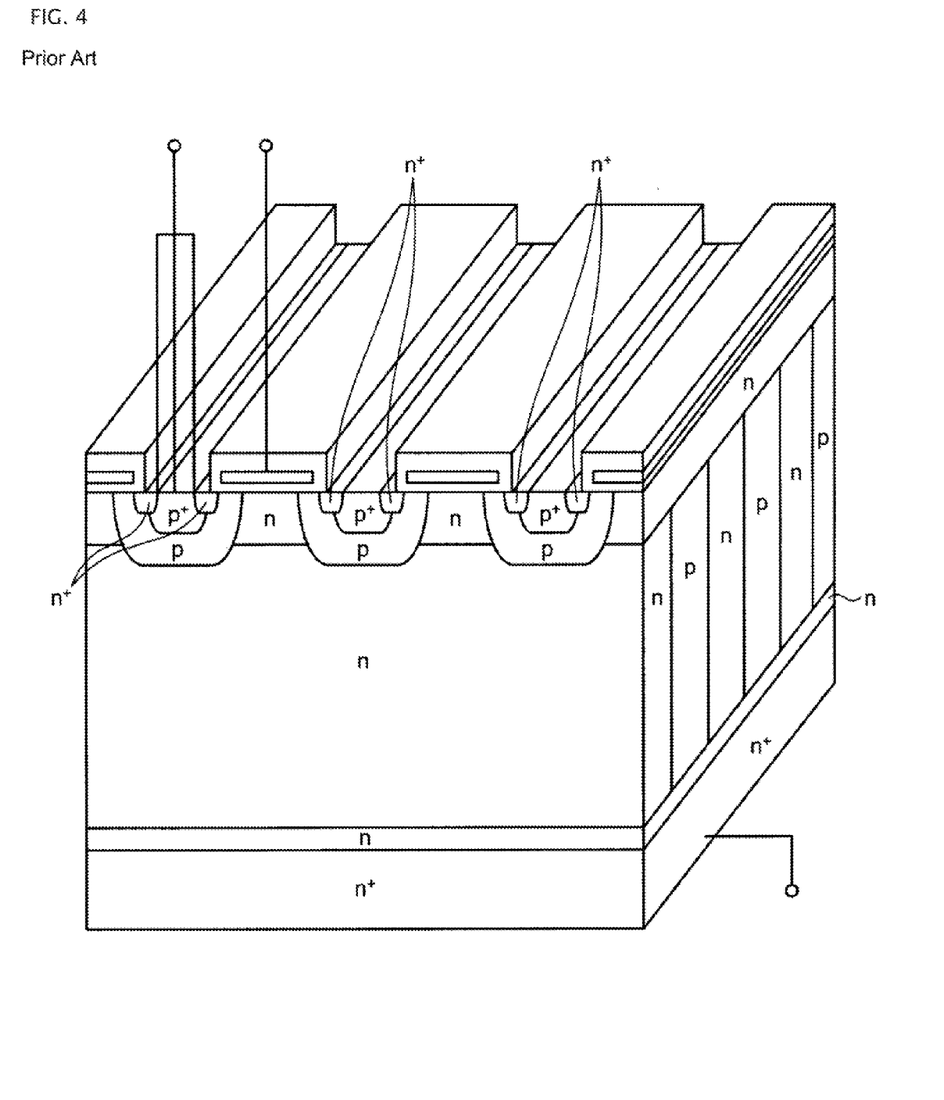
FIG. 4 is a partial cross-sectional perspective diagram of another conventional SJ-MOSFET.

When a surface pattern of the p and n columns forming the super-junction structure, as viewed from above the wafer, has a stripe pattern in a longitudinal direction, as depicted in FIG. 3, which is a partial, cross-sectional perspective diagram of the conventional super-junction (SJ-) MOSFET, it is preferable that, in light of device characteristics, a MOS cell stripe pattern in the longitudinal direction be parallel to the stripe pattern of the super-junction structure. When the two stripes are orthogonal, as depicted in FIG. 4, which is a partial, cross-sectional perspective diagram, a current path in the vicinity of the surface is twisted, increasing the on-resistance. If the two stripes are parallel, the problem of twisted current paths does not occur and low on-resistance is maintained.

At the time of switching operation of the MOSFET, parasitic capacity components, namely, gate-source capacity Cgs, drain-source capacity Cds, and gate-drain capacity Cgd, significantly affect switching waveform. In particular, when the gate-drain capacity Cgd is too large, Miller capacity increases, switching becomes slow, and switching loss increases. On the other hand, when the gate-drain capacity Cgd is too small, the switching loss becomes small but the rate of rise of the drain-source voltage Vds at the time of turn-off becomes too large, causing radiation noise and adversely affecting external apparatuses. Therefore, design of a structure to bring the gate-drain capacity Cgd to an appropriate value is very important for the switching characteristics.

Further, description has been disclosed for a super-junction-structure semiconductor device having a structure where the p column layer is connected by a p-type intermediate region (see, e.g., Patent Documents 1 and 2 below).

CITATION LIST

Patent Literature

PTL 1: Japanese Patent Application Laid-Open Publication No. 2006-351713 (paragraph 0024, FIG. 2)
PTL 2: Japanese Patent Application Laid-Open Publication No. 2008-10896 (paragraph 0028, FIG. 6)

SUMMARY OF INVENTION

Technical Problem

Figure 5:
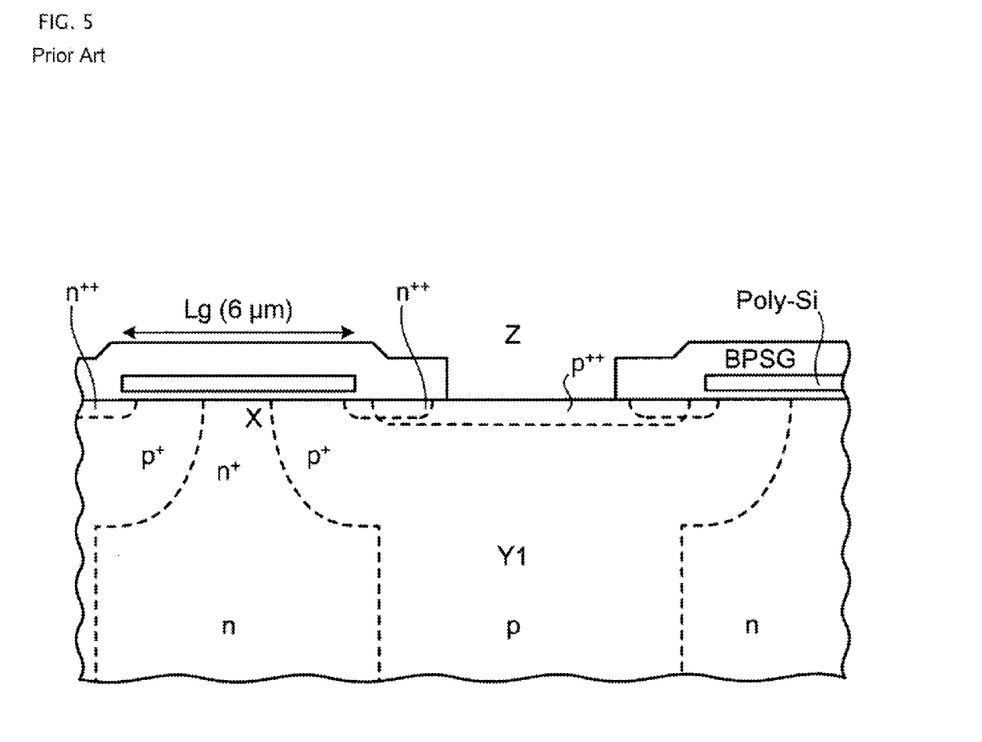
FIG. 5 is an enlarged cross-sectional diagram of the vicinity of MOS structure of the conventional SJ-MOSFET.
Figure 6:
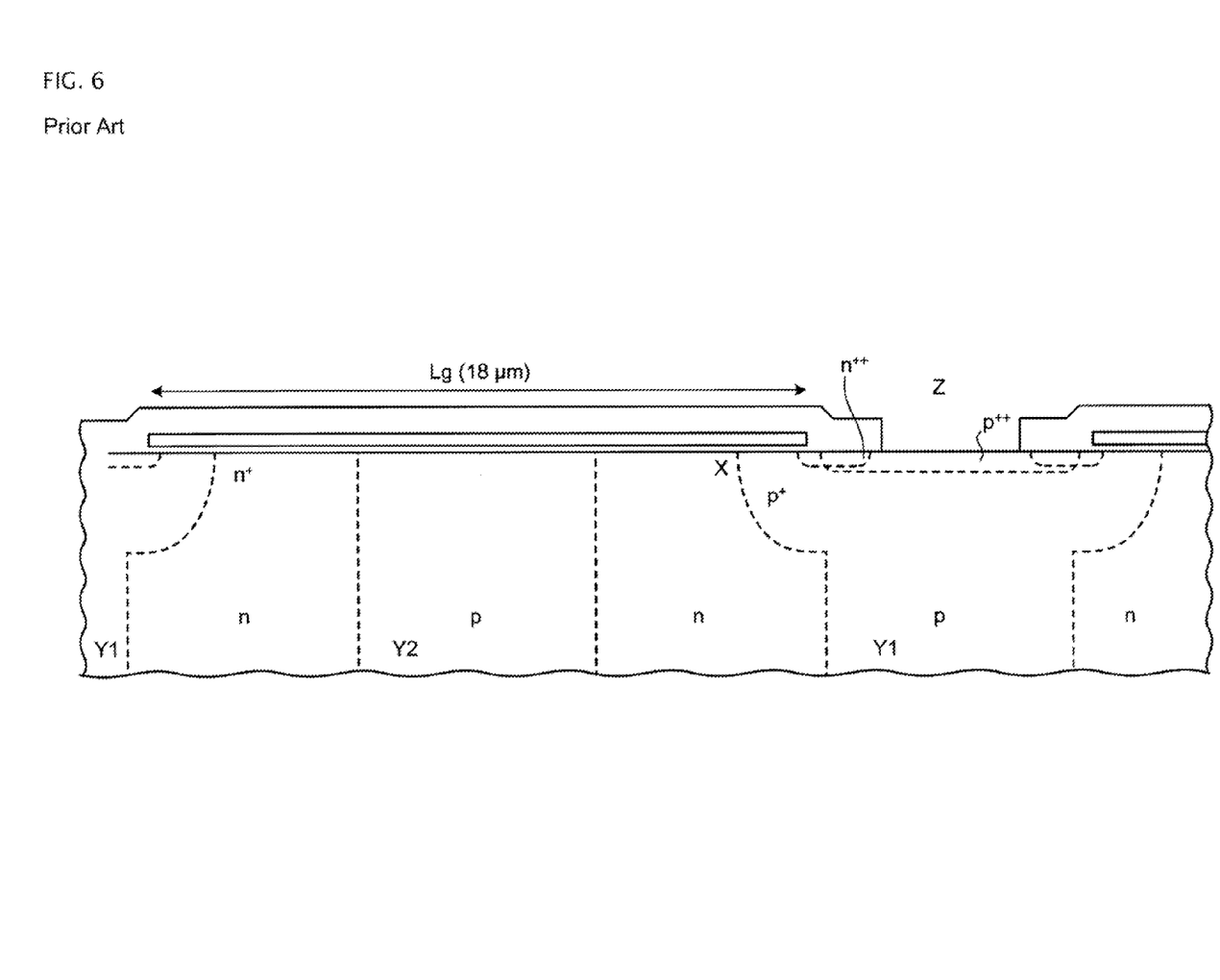
FIG. 6 is an enlarged cross-sectional diagram of the vicinity of the MOS structure of the improved SJ-MOSFET of FIG. 5.

To adjust the gate-drain capacity Cgd, adjustment by gate width (Lg) is necessary. However, in the super-junction semiconductor device in which the super-junction stripe pattern and the MOS cell strip pattern are parallel, since the gate width (Lg) is intrinsically narrow as depicted by a two-headed arrow in FIG. 5 (an enlarged cross-sectional diagram of the area near the MOS structure of the conventional SJ-MOSFET) adjustable magnitude of the gate width (Lg) is small and further miniaturization is difficult in practice. Furthermore, the p column Y1 forming the super-junction structure and the MOS cell stripe Z must be arranged to be in precise positional alignment vertically. Therefore, the cell pitch of the MOS cell stripe Z is the same as that of the p column. If the relative positional relationship of the p column Y1 and the MOS cell stripe Z deviates and an exit X of the MOS channel and the p column Y1 overlap each other, there will be no outlet for the electric current and the device cannot be turned on. As a measure to prevent the problem of deviated positions, if the MOS cell stripe Z is arranged over every other super-junction p column Y1 or every given number of super-junction p columns Y1, as an improvement of the structure depicted in FIG. 5 and as depicted in FIG. 6, which is an enlarged cross-sectional diagram, the gate width (Lg) can be increased. The arrangement of the p column as depicted in FIG. 6 will make it possible to adjust the gate width (Lg) and adjust the gate-drain capacity Cgd to an appropriate value even in a structure in which the super-junction stripe and the MOS cell stripe are parallel.

However, even in the structure depicted in the enlarged cross-sectional diagram of FIG. 6 and conceived as a measure against the SJ-MOSFET problem depicted in the enlarged cross-sectional diagram of FIG. 5, a new problem arises which will be described below. The problem is that the p column Y2 for which the MOS cell stripe Z is not arranged as depicted in FIG. 6 is in an electrically floating state.

To be more specific, in repeated switching operation at high speed, at the time of off state, the drain-source capacity Cds is charged by being depleted and the floating p column Y2 charges. At the time of on state again, the charge accumulated in the floating p column Y2 has no escape and the p column Y2, remaining charged, is in an electrically floating state. For this reason, a depletion layer is maintained extending from the p column-n column junction, the width of the n column neutral region as a pathway of the electric current becomes narrow, and the on-resistance increases. As a result, a problem arises in that the generation loss increases at the time of switching operation.

The present invention is conceived in light of the problems described above. An object of the present invention is to provide a super-junction semiconductor device capable of reducing the rise of transient on-resistance at the time of repeated switching operation notwithstanding the super-junction semiconductor device having a striped super-junction structure with a super-junction stripe and a MOS cell stripe arranged in parallel and having a floating-potential p column over which no MOS cell stripe is arranged to increase gate-drain capacity.

Solution to Problem

To achieve an object of the present invention a super-junction semiconductor device includes a super-junction structure having, on a primary plane of a first-conduction-type semiconductor substrate, laminar first-conduction-type layers and second-conduction-type layers that are formed vertically with respect to the primary plane, in a plane parallel to the primary plane, and are arranged in parallel, alternating in position; a high-density, second-conduction-type base region formed to overlap along a longitudinal direction a surface layer of the second-conduction-type layer of the super-junction structure; a high-density, first-conduction-type source region selectively formed along a longitudinal direction on a surface layer of the high-density, second-conduction-type base region; and a gate electrode formed along a longitudinal direction, through an insulation film on a surface of the high-density, second-conduction-type base region sandwiched between the laminar first-conduction-type layer and the high-density, first-conduction-type source region, where the second-conduction-type layers of the super-junction structure are disposed along the longitudinal direction through the insulation film on a lower layer of the gate electrode, and the second-conduction-type layers of the super-junction structure are conductively interconnected at an end.

Further, conductive connection may be by interconnection of the second-conduction-type layers of the super-junction structure at the end. Furthermore, the conductive connection may be by the high-density, second-conduction-type base region connected at the end of the second-conduction-type layer of the super-junction structure.

Additionally, the conductive connection can be by a conductive layer or a metal film formed so as to connect the end surface of the second-conduction-type layers of the super-junction structure. In other words, the present invention has a structure in which the end of the stripe of the p column over which no MOS cell stripe is arranged and the end of the p column over which the MOS cell stripe is arranged are connected. This structure makes it possible to prevent the potential of the p column over which no MOS cell stripe is arranged from becoming the floating potential. In a state in which the drain-source bias is zero or low and the p column is not completely depleted, the source electrode, the p column over which the MOS cell stripe is arranged, and the p column over which no MOS cell stripe is arranged are electrically connected to one another at the end of the stripe and come to have the same potential. In the off state, the charge is accumulated in the p column over which no MOS cell stripe is arranged and in the on state in which the drain-source bias is nearly zero, the charge is quickly discharged through the pathway that is electrically connected at the end as described above and there is no depletion layer that remains extended. Therefore, since there is no narrowing of the width of the n column neutral region which narrows the width of the pathway of the electric current, the rise of the transient on-resistance may be reduced at the time of continuous switching.

Advantageous Effects of Invention

In the super-junction semiconductor device that is a striped super-junction semi-conductor device having the super-junction stripe and the MOS cell stripe arranged in parallel and that is structured to provide the floating-potential p column over which no MOS cell stripe is arranged to increase the gate-drain capacity, the super-junction semiconductor device may be provided that is capable of reducing the rise of the transient on-resistance at the time of the repeated switching operation by the charging of the floating-potential p column.

DESCRIPTION OF EMBODIMENTS

With reference to the accompanying drawings, an embodiment of the super-junction semiconductor device of the present invention will be described in detail hereinafter. The present invention is not to be limited to the following description of the embodiment without departing from the scope of the invention.

Embodiment

Figure 1:
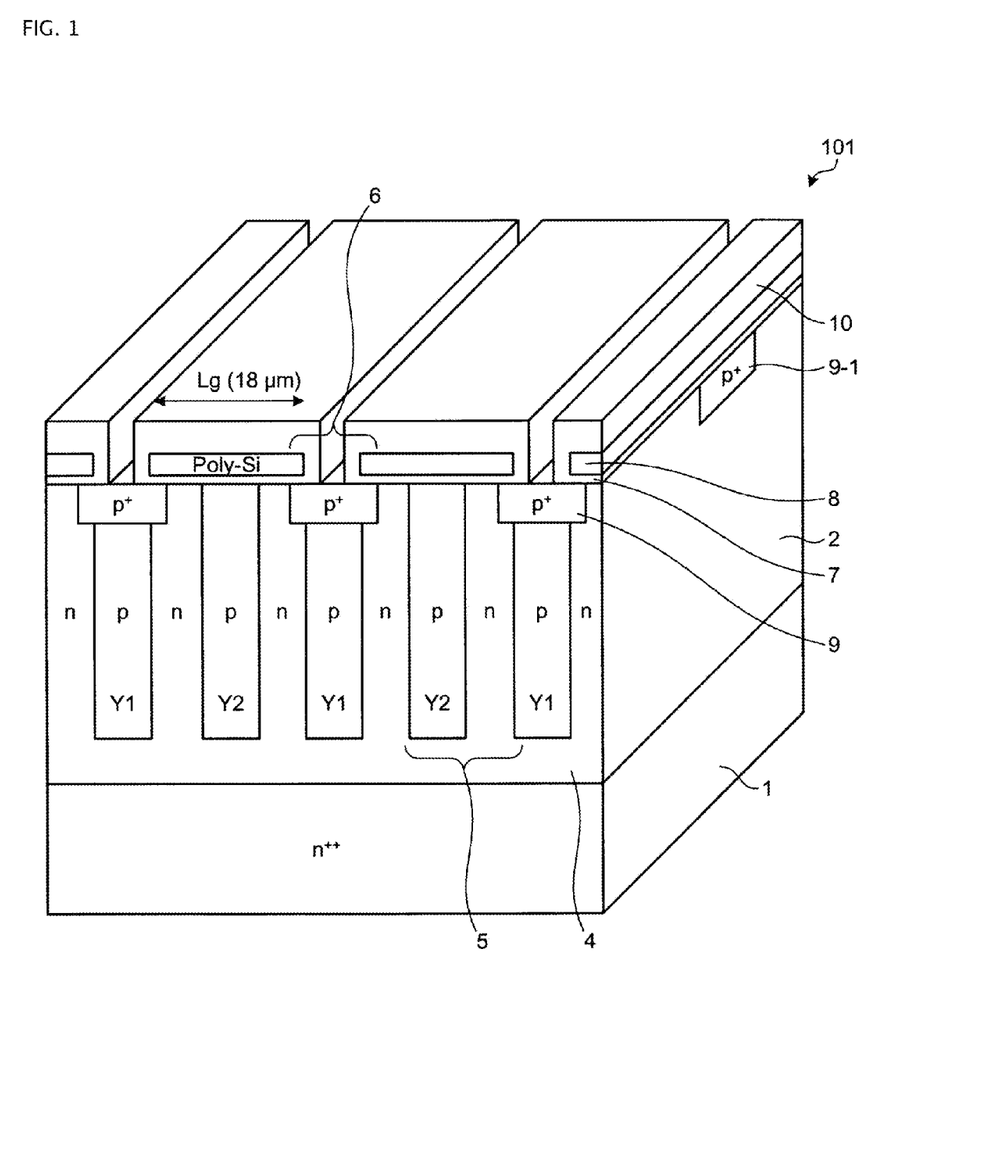
FIG. 1 is a partial cross-sectional perspective diagram of a SJ-MOSFET of 600 V withstanding voltage according to the present invention.
Figure 2:
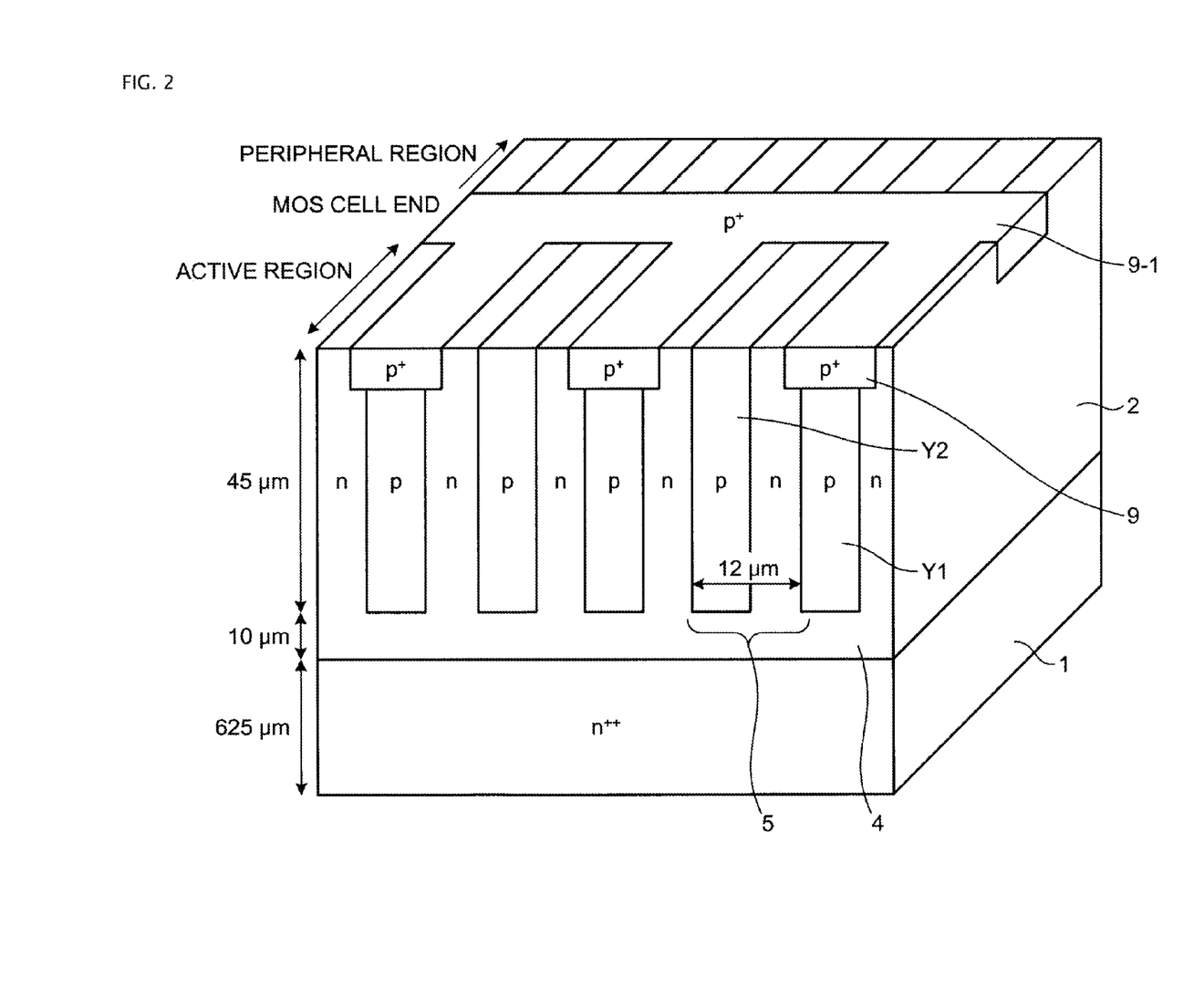
FIG. 2 is a partial cross-sectional perspective diagram of the SJ-MOSFET of 600 V withstanding voltage according to the present invention.
Figure 7:
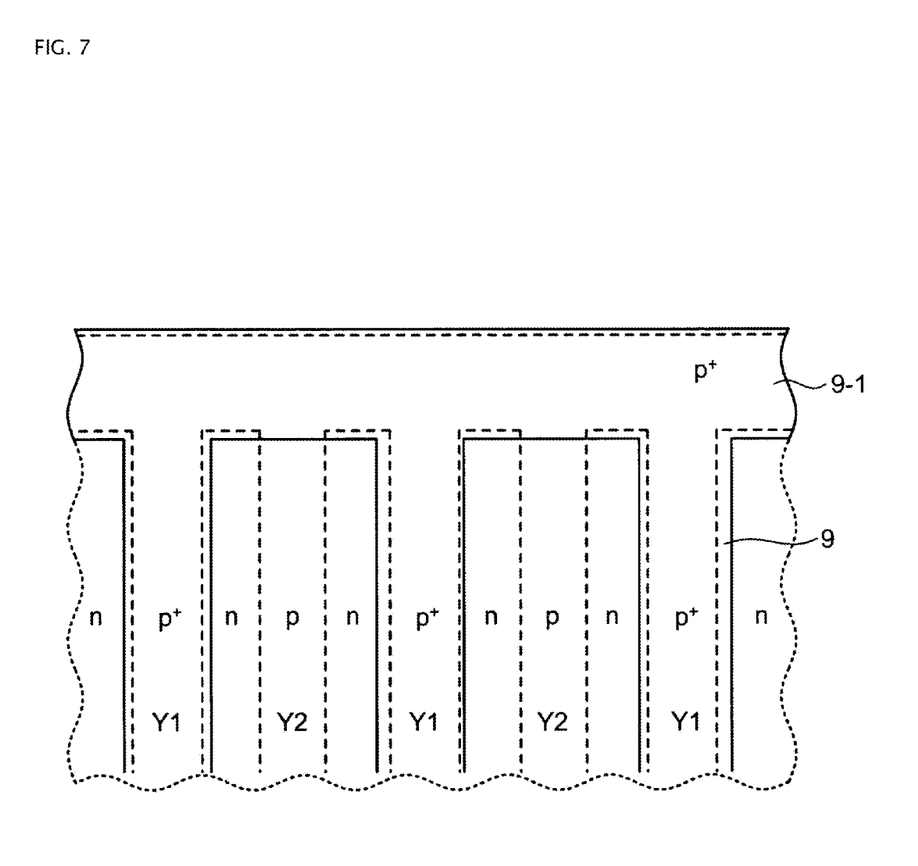
FIG. 7 is a partial plan view of a pn column structure according to the SJ-MOSFET of the present invention.
Figure 11:
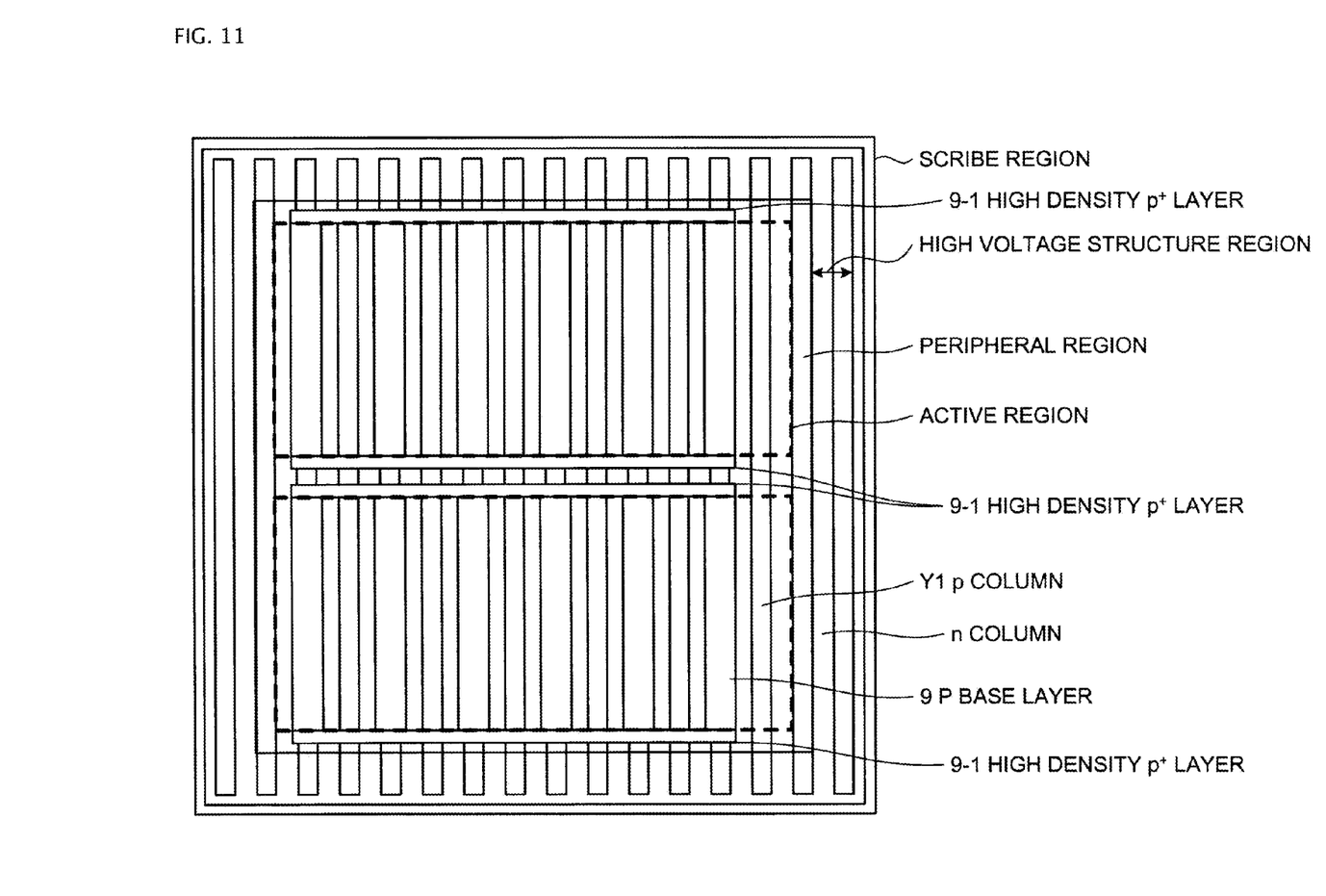
FIG. 11 is a plane diagram of conductive connections of parallel p columns by a p base layer in a super-junction semiconductor device of the present invention.

An example of application of the super-junction semiconductor device of the present invention to an SJ-MOSFET 101 that is a multi-epi system capable of withstanding 600V is depicted in FIGS. 1 and 2. Over an n-type semiconductor substrate 1 having a thickness of 625 micrometers, an epitaxial growth layer having a thickness of 55 micrometers is formed and from the surface thereof down to a depth of 45 micrometers, laminar p columns Y1 are formed in parallel. From the depth of 45 micrometers to 55 micrometers is an n-type buffer layer 4. The pitch of pn columns 5 forming the super-junction structure is 12 micrometers as depicted by a two-headed arrow in FIG. 2 and the p column width and the n column width are each 6 micrometers. The p and n columns depict a parallel stripe pattern as viewed from the surface of the substrate. The average density of the p and n columns is $4*10^{15}$ cm$^{-3}$. MOS cells 6 (FIG. 1) as viewed from the substrate surface, depict a pattern of stripes parallel to the stripes of the pn columns 5 and are positioned above and are aligned with the p column Y1 with precision. Since one MOS cell stripe per two p column stripes is arranged, the pitch of the MOS cell stripe is 24 micrometers, twice the pn column pitch of 12 micrometers. As depicted in FIG. 1, a 0.1 micrometers thick gate oxide film 7 is formed on the substrate surface and above the gate oxide film 7, a 0.5 micrometers thick polysilicon gate electrode 8 is formed. Inside a high density p base layer 9 formed overlapping every second p column Y1, an n-type source region is formed along the longitudinal direction of the stripe pattern (not depicted in FIG. 1 or 2). As depicted in FIGS. 2 and 7, plural parallel p columns Y1 are connected to one another by a high density p+ layer 9-1 formed concurrently with the high density p base layer 9 and are conductively connected. One example of the position of the high density p base layer 9 is depicted in FIG. 11 as an overall plane diagram of a semiconductor device chip. Further, over the polysilicon gate electrode 8, an interlayer insulation film 10 is formed, over which an Al electrode (not depicted) is formed, and further over the Al electrode, a protective film (not depicted) is formed.

Except for the non-depicted source region, each layer undergoes patterning as depicted in FIG. 1 and forms the SJ-MOSFET 101. A drain electrode, a source electrode, a protective film, and an n-type source region are omitted from FIG. 1. Since the p column Y2 over which no MOS cell is arranged is present as every other column, an overlapping area of the polysilicon gate electrode 8 and the drain increases and the gate-drain parasitic capacity Cgd increases, as compared with the conventional structure of arranging the MOS cell over every p column.

The polysilicon gate width in this embodiment is 18 micrometers, three times the polysilicon gate width of 6 micrometers in the conventional structure. In consideration of lateral diffusion of the p base layer 9 below the polysilicon gate electrode 8, the gate-drain parasitic capacity Cgd in this embodiment is about 7 times that of the conventional example. At the end of the MOS cell stripe that is the region where an active region transitions to a peripheral region, the p column stripes are electrically connected to one another by the high density p layer formed at the end concurrently with the p base layer 9 of the MOS structure.

Figure 12:
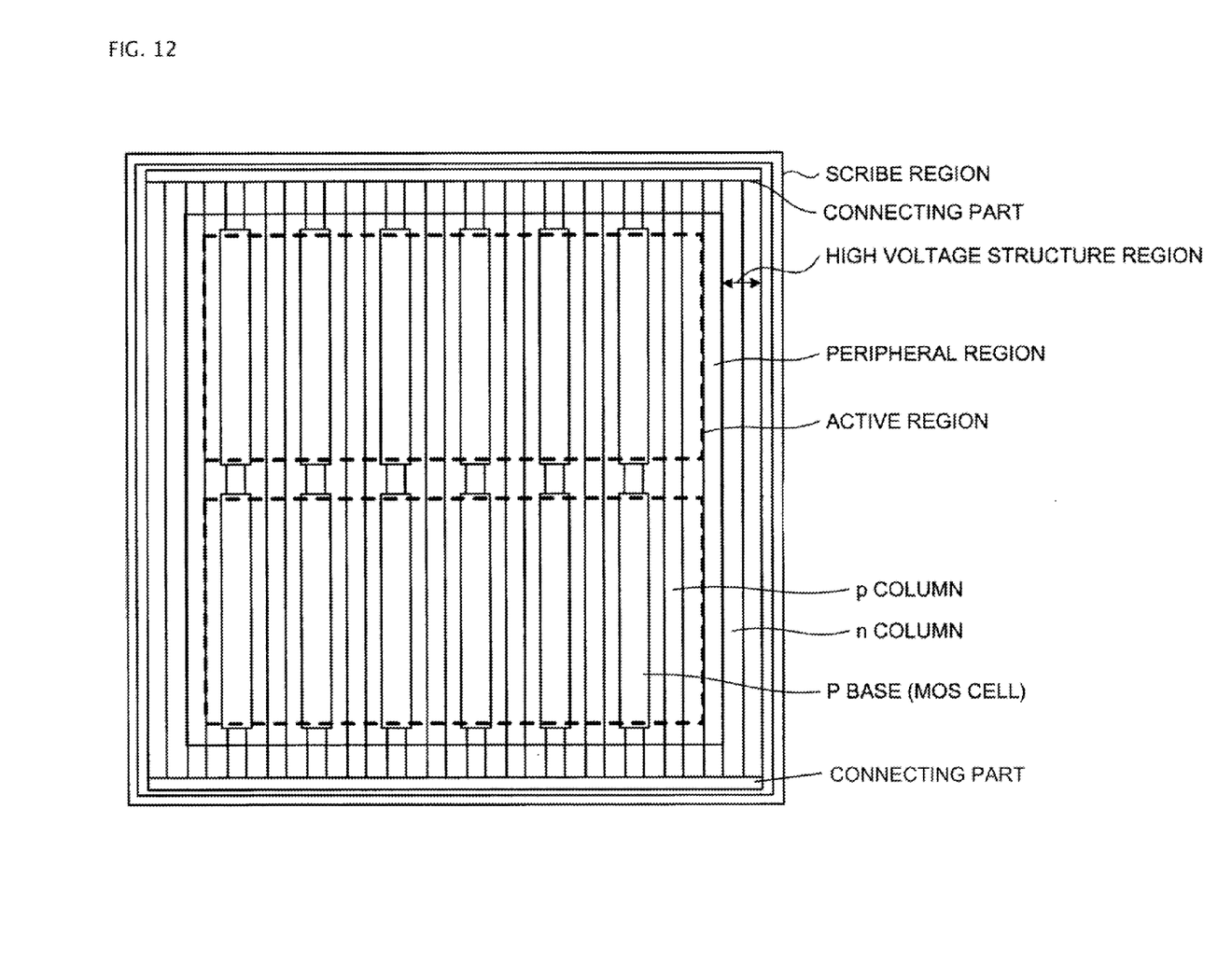
FIG. 12 is a plane diagram of connections of parallel p columns at the end of the p column in the super-junction semiconductor device of the present invention.

When the drain-source bias is not applied or is low, the p column is not completely depleted and therefore, all p columns are of the same potential. As depicted in FIG. 12, a plane diagram of a chip, the p column stripes may be connected at the end of the p column stripe further outside the peripheral region to be conductively connected. The p column stripes may be connected by a p layer formed concurrently with the p column or a metal film or a conductive layer formed on the end surface.

Figure 8:
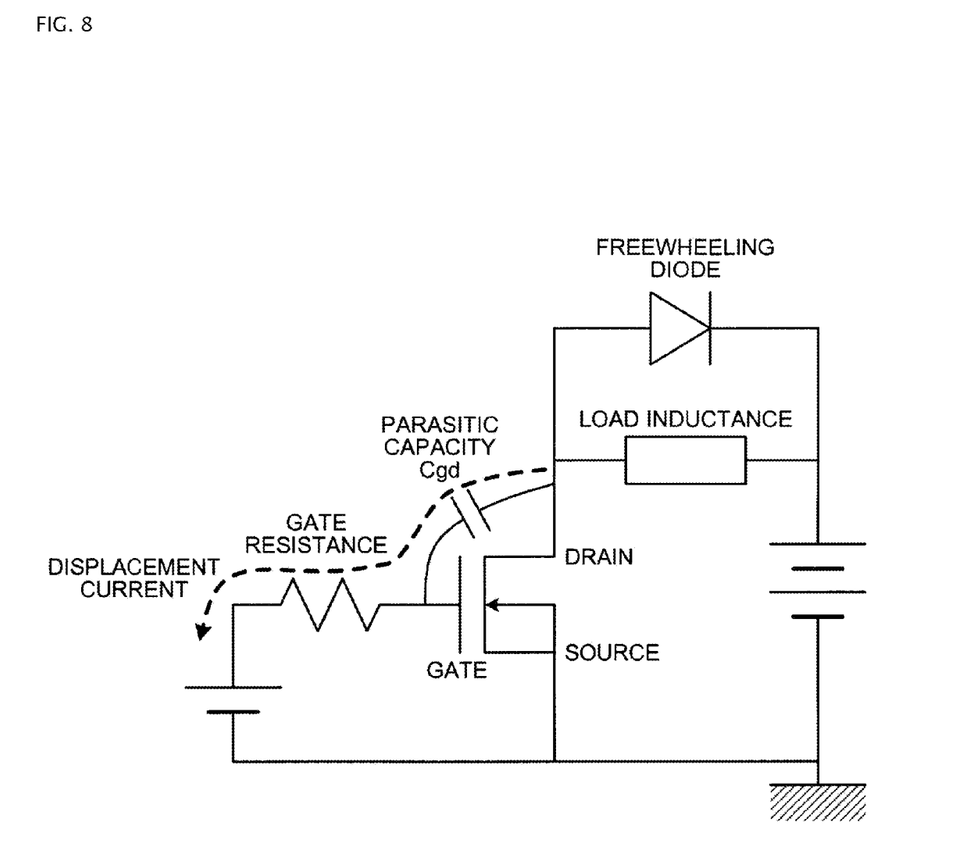
FIG. 8 is a circuit diagram of an inductive load chopper employing the SJ-MOSFET.

An effect will be described of the conductive connection of the p columns Y1 and Y2. At the time of repeated switching operation of the SJ-MOSFET used in an inductive load chopper circuit as depicted in FIG. 8, the SJ-MOSFET starts the turn-off operation when the gate is turned off. Since the load inductance makes an effort to maintain the current, a high bias is applied between the source and the drain. According to the rise of the drain current, displacement current flows through the gate-drain capacity Cgd and the voltage drop by the flow of the displacement current through gate resistance causes the gate potential to rise. The rise of the gate potential works in such a manner as to maintain the drain current (ID). As the gate-drain capacity Cgd becomes greater, a greater displacement current can flow at a small drain potential increase rate and the gate potential can be highly maintained. Thus, the current flowing through the load inductance can be maintained.

Figure 9:
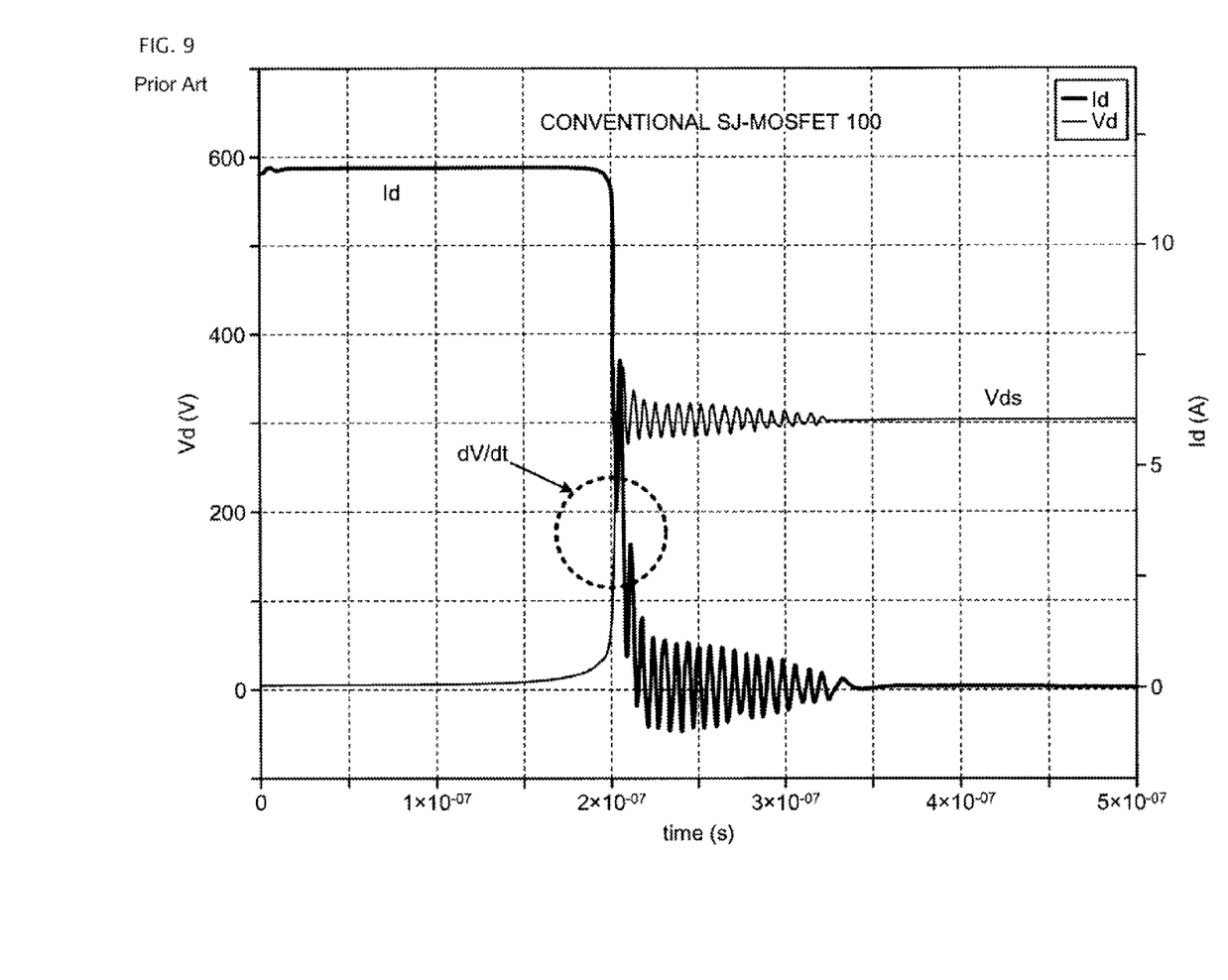
FIG. 9 is a turn-off waveform diagram of the conventional SJ-MOSFET.
Figure 10:
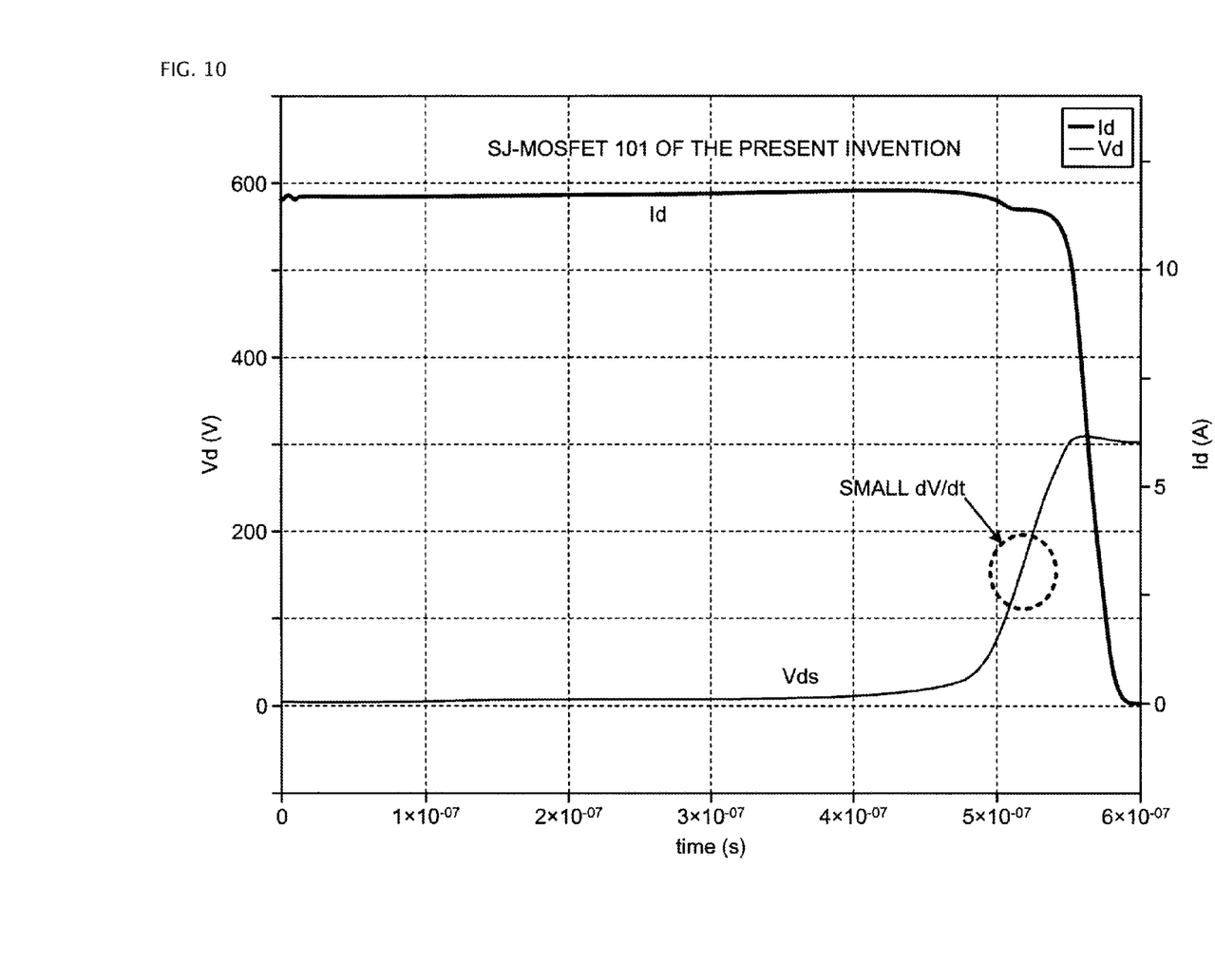
FIG. 10 is a turn-off waveform diagram of the SJ-MOSFET of the present invention.

That is to say, as compared with an increase rate (dV/dt) of a drain-source voltage (Vds) at the time of turn-off of the conventional SJ-MOSFET 100 having a small gate-drain capacity (Cgd) depicted in FIG. 9, the SJ-MOSFET 101 of the present invention has great gate-drain capacity (Cgd) and therefore, dV/dt of the drain-source voltage (Vds) at the turn-off time may be kept small as depicted in FIG. 10. As a result, the radiation noise can be reduced. The drain potential continues to rise and the p and n columns are completely depleted. When the drain-source voltage becomes equal to a bus voltage of the circuit, the drain current gradually decreases to zero. Thus, the turn-off operation is completed.

Then, when the gate is turned on again after a certain period of time, the turn-on operation starts. The turn-on progresses in a process reverse to that of the turn-off and transitions to a complete on state. Inside the depletion layer generated in the n and p columns in the off state, space charge (actually, an ionized dopant) is accumulated and by disappearance of all space charge, the state transitions to the on state. The space charge in the n column disappears with the supply of electrons from the drain electrode through an n-type low resistivity substrate on the drain side. On the other hand, the space charge in the p column disappears with supply of a hole from the source electrode through the MOS cell p base layer 9. In the on state, the drain-source voltage is several tenths of a volt to several volts and the p and n columns are in a neutral state with a carrier remaining. In the SJ-MOSFET 101 of the present invention, the p columns, which are connected to one another at the end of the cell stripe and are in a neutral state, have the same potential. For this reason, even in the p column Y2 over which no MOS cell p base layer is arranged, the hole is quickly supplied by way of the p column Y1 over which the MOS cell p base layer is arranged and the space charge disappears. Even in the p column Y2 over which no MOS cell p base layer is arranged, there is no depletion layer remaining and therefore, with no compression of the n column neutral region width, there is no narrowing of the current pathway and an effect of suppressing the rise of the on-resistance is achieved.

According to the present invention, since the super-junction structure having the striped parallel surface pattern is provided, the super-junction stripe and the MOS cell stripe are parallel, and the p column over which no MOS cell stripe is arranged and the p column over which the MOS cell stripe is arranged are connected at an end to have the same potential, radiation noise can be suppressed by the reduction of the dV/dt value at the time of turn-on and the rise of the transient on-resistance can be reduced at the time of repeated switching operation. As a result, the super-junction MOSFET is realized, which has both the low noise characteristic and low loss.

REFERENCE SIGNS LIST 1 semiconductor substrate
2 epitaxial growth layer
4 n-type buffer layer
5 pn columns
6 MOS cell
7 gate insulation film 8 gate electrode
9 p base layer
9-1 high density p+ layer
10 interlayer insulation film
Y1, Y2 p column
Lg gate width
100 conventional SJ-MOSFET
101 SJ-MOSFET of present invention

The invention claimed is:

1. A super-junction semiconductor device comprising:
a first-conduction type of a semiconductor substrate,
a primary plane of the first-conduction-type semiconductor substrate,
a super-junction structure having a first primary plane and a second primary plane, wherein the primary plane of the first-conduction-type semiconductor substrate and the first primary plane are in contact with each other, and
MOS cell structures formed on the second primary plane side of the super-junction structure,
wherein the super-junction structure includes first-conduction-type layers and second-conduction-type layers arranged in parallel to the primary plane, alternating in position to form a stripe pattern in plain view,
wherein the MOS cell structures include:
high-density, second-conduction-type base regions formed to overlap along a longitudinal direction of the stripe pattern on alternating layers of the second-conduction-type layers of the second primary plane side of the super-junction structure,
high-density, first-conduction-type source regions formed along a longitudinal direction on surface layers of the high-density, second-conduction-type base regions,
gate electrodes formed along a longitudinal direction of the stripe pattern, through an insulation film on surfaces between the high-density, first-conduction-type source regions formed on the second-conduction-type base regions next to each other,
wherein the second-conduction-type layers on which any of the MOS cell structures is not formed are arranged between the high-density, second-conduction-type regions next to each other in a wide direction orthogonal to the longitudinal direction of the stripe pattern,
wherein the high-density, second-conduction-type base regions and the second-conduction-type layer on which any of the MOS cell structures is not formed are in conductive connection with each other, and wherein the conductive connection is by a high-density, second-conduction-type layer formed along the wide direction orthogonal to the longitudinal direction of the stripe pattern, connecting the end portion of the high-density, second-conduction-type base regions and the second-conduction-type layers.

2. The super-junction semiconductor device according to claim 1, wherein
one layer of the second-conduction-type layers on which any of the MOS cell structures is not arranged is sandwiched between the high-density, second-conduction-type base regions next to each other.

3. The super-junction semiconductor device according to claim 1, wherein
the high-density, second-conduction-type base regions are formed on the surface layer of the second primary plane of the super-junction structure.

4. The super-junction semiconductor device according to claim 1, wherein
the high-density, second-conductive-type layer has a impurity concentration higher than that of the second-conduction-type layer.

5. A super-junction semiconductor device comprising:
a first-conduction type of a semiconductor substrate,
a primary plane of the first-conduction-type semiconductor substrate,
a super-junction structure having a first primary plane and a second primary plane, wherein the primary plane of the first-conduction-type semiconductor substrate and the first primary plane are in contact with each other, and
MOS cell structures formed on the second primary plane side of the super-junction structure,
wherein the super-junction structure includes first-conduction-type layers and second-conduction-type layers arranged in parallel to the primary plane, alternating in position to form a stripe pattern in plain view,
wherein the MOS cell structures include:
high-density, second-conduction-type base regions formed to overlap along a longitudinal direction of the stripe pattern on alternating layers of the second-conduction-type layers of the second primary plane side of the super-junction structure,
high-density, first-conduction-type source regions formed along a longitudinal direction on surface layers of the high-density, second-conduction-type base regions,
gate electrodes formed along a longitudinal direction of the stripe pattern, through an insulation film on surfaces between the high-density, first-conduction-type source regions formed on the second-conduction-type base regions next to each other,
wherein the second-conduction-type layers on which any of the MOS cell structures is not formed are arranged between the high-density, second-conduction-type regions next to each other in a wide direction orthogonal to the longitudinal direction of the stripe pattern,
wherein the high-density, second-conduction-type base regions and the second-conduction-type layer on which any of the MOS cell structures is not formed are in conductive connection with each other, and wherein the conductive connection is by a conductive layer or a metal film formed so as to connect the end surface of the second-conduction-type layers of the super-junction structure.

6. The super-junction semiconductor device according to claim 5, wherein
one layer of the second-conduction-type layers on which any of the MOS cell structures is not arranged is sandwiched between the high-density, second-conduction-type base regions next to each other.

7. The super-junction semiconductor device according to claim 5, wherein
the high-density, second-conduction-type base regions are formed on the surface layer of the second primary plane of the super-junction structure.

* * * * *